United States Patent
Song et al.

(10) Patent No.: US 7,778,103 B2
(45) Date of Patent: Aug. 17, 2010

(54) SEMICONDUCTOR MEMORY DEVICE FOR INDEPENDENTLY SELECTING MODE OF MEMORY BANK AND METHOD OF CONTROLLING THEREOF

(75) Inventors: Eugene Song, Seoul (KR); Young-min Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 309 days.

(21) Appl. No.: 12/078,257

(22) Filed: Mar. 28, 2008

(65) Prior Publication Data

US 2008/0247260 A1 Oct. 9, 2008

(30) Foreign Application Priority Data

Apr. 5, 2007 (KR) ...................... 10-2007-0033761

(51) Int. Cl.
G11C 8/00 (2006.01)
(52) U.S. Cl. .............................. 365/230.03; 365/230.06
(58) Field of Classification Search ............ 365/230.03, 365/230.06
See application file for complete search history.

(56) References Cited

U.S. PATENT DOCUMENTS 6,118,724 A * 9/2000 Higginbottom ........ 365/230.05
7,529,149 B2 * 5/2009 Pyeon et al. ........... 365/230.03
7,573,772 B2 * 8/2009 Nam et al. ................. 365/222

FOREIGN PATENT DOCUMENTS

| KR | 2001-0086035 | 9/2001 |
|----|--------------|--------|
| KR | 1020050035699 | 4/2005 |
| KR | 1020050112973 | 12/2005 |

OTHER PUBLICATIONS

Abstract of WO 00/29957 published May 5, 2000.

* cited by examiner

Primary Examiner—Tuan T. Nguyen
(74) Attorney, Agent, or Firm—Harness, Dickey & Pierce, P.L.C.

(57) ABSTRACT

A semiconductor memory device in which a mode of a memory bank may be independently selected and a method of controlling the semiconductor memory device may be provided. The semiconductor memory device with a plurality of banks may include a plurality of bank groups that each may have at least one bank from among the plurality of banks, and a memory controller that may control a read/write operation to be performed on a bank belonging to a bank group from among the plurality of bank groups, in response to a control signal, where different modes or the same mode may be applied to the bank groups. Accordingly, different modes or the same mode may be applied to the banks so that the read/write operation may be performed on a bank having a mode that is advantageous to the type of data, thereby minimizing consumption of power and a time delay.

30 Claims, 4 Drawing Sheets

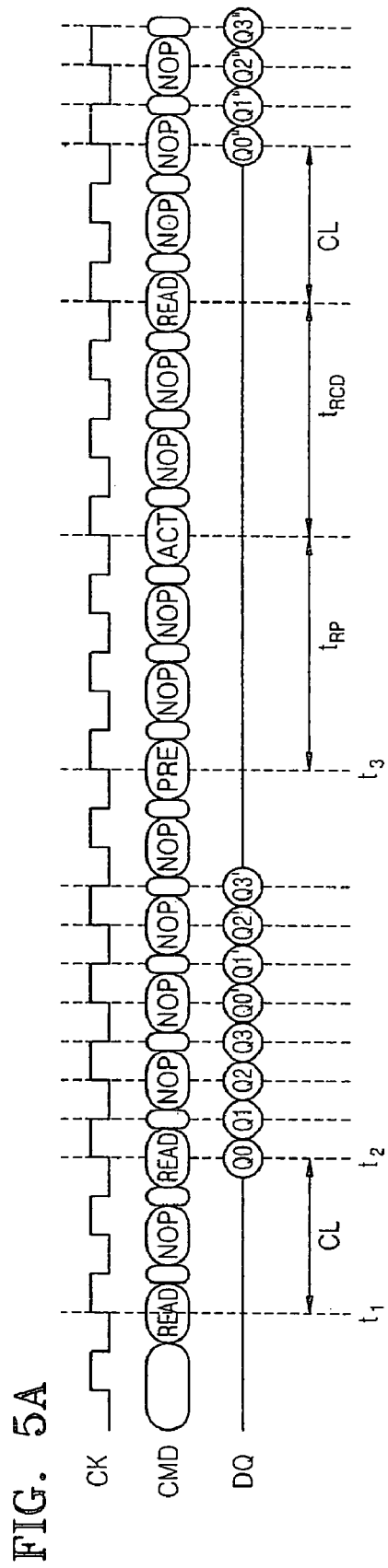
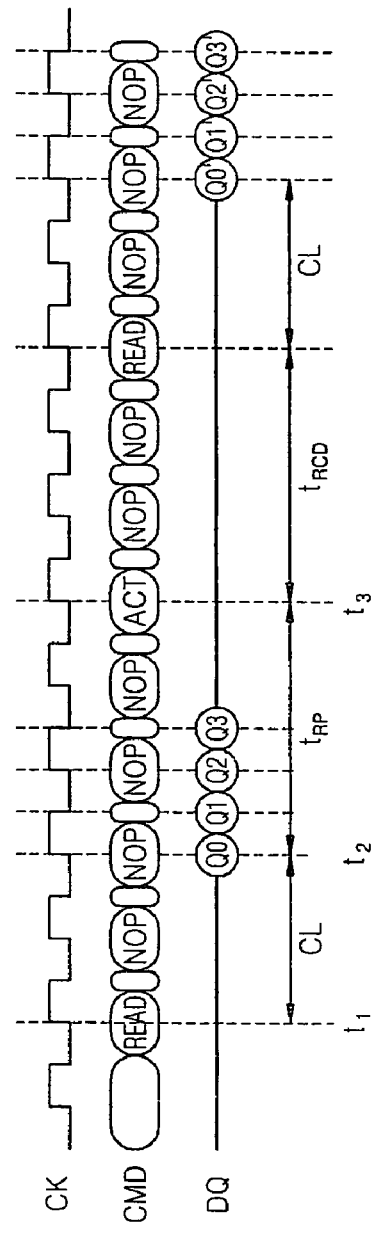
FIG. 5A (CONVENTIONAL ART)
FIG. 5B

SEMICONDUCTOR MEMORY DEVICE FOR INDEPENDENTLY SELECTING MODE OF MEMORY BANK AND METHOD OF CONTROLLING THEREOF

PRIORITY STATEMENT

This application claims the benefit of Korean Patent Application No. 10-2007-0033761, filed on Apr. 5, 2007, in the Korean Intellectual Property Office, the disclosure of which is incorporated herein in its entirety by reference.

BACKGROUND

A synchronous dynamic random access memory (SDRAM), which is a type of memory, may be used in various types of computing devices, and may be accessed by various types of processors. A memory controller may generate a signal for controlling a read/write operation of a memory, in response to a command and an address given by a processor. In the case of the SDRAM, a row in which a memory cell is located must generally be activated before the memory cell may be accessed. One of the operations of the memory controller may be to determine whether a row that is to be accessed is activated. If the row that is to be accessed is not activated, the memory controller may activate the row before performing the read/write operation in the row. Another operation of the memory controller may be to deactivate a previously accessed row when a new row is accessed.

Also, the SDRAM may perform a precharge operation after performing the read/write operation. If the precharge operation is performed, an activated row may be deactivated and a voltage of a column may be set as a precharge voltage. The precharge operation may need an additional clock cycle. If the same row of the same memory bank ("bank") is continuously accessed, it may be better for the SDRAM not to perform the precharge operation. If one row and then another row are sequentially accessed in the SDRAM, the precharge operation must generally be performed. However, a conventional memory controller may not control the precharge operation to be performed according to whether the same row in the same bank is repeatedly accessed. That is, the conventional memory controller may apply either an auto precharge mode or an open page mode to all banks of an SDRAM. The auto precharge mode may be a mode in which a memory automatically performs the precharge operation after performing the read/write operation. The open page mode may be a mode in which an activated row remains activated until a precharge command is given from the memory controller. If one row and then another row are sequentially accessed in a bank, the auto precharge mode may be preferable, and if the same row is repeatedly accessed in the same bank, the open page mode may be preferable. However, conventionally, only one of the auto precharge mode and the open page mode may be applied to all banks of the memory as described above, thereby increasing unnecessary consumption of power and time.

SUMMARY

Example embodiments may provide a semiconductor memory device in which different modes may be applied to banks of a memory so that a read/write operation may be performed on a bank having mode which may be advantageous to the type of data, thereby reducing unnecessary consumption of power and time.

Example embodiments may also provide a method of controlling the semiconductor memory device.

According to example embodiments, there may be provided a semiconductor memory device including a memory having a plurality of banks and a memory controller controlling a read/write operation to be performed on data stored in one of the plurality of banks, in response to a control signal. One of different modes and a same mode may be applied independently to the plurality of banks.

According to example embodiments, the memory may include a plurality of bank groups, each bank group having at least one of the banks, and the same mode may be applied to each bank of a bank group.

An auto precharge mode may be applied to a bank group and an open page mode is applied to another bank group.

An auto precharge mode and an open page mode may be applied to the plurality of bank groups.

The logic level of the control signal may depend on a type of the data.

The control signal may have a first level when the data randomly accesses a row of a bank and a second level when the data repeatedly accesses the same row in a bank.

The memory controller may control the read/write operation to be performed on a bank belonging to one of the plurality of bank groups to which an auto precharge mode is applied, when the control signal has the first level.

The memory controller may control the read/write operation to be performed on a bank belonging to one of the plurality of bank groups to which an open page mode is applied, when the control signal has the second level.

According to example embodiments, the memory controller may further include a plurality of registers storing mode information corresponding to the plurality of banks, and/or an operation control unit controlling a read/write operation to be performed on one of the plurality of banks, in response to the control signal.

The mode information may include one of an auto precharge mode information and open page mode information.

The logic level of the control signal may depend on a type of the data.

The control signal may have a first level when the data randomly accesses a row of a bank and a second level when the data repeatedly accesses the same row in a bank.

The operation control unit may control the read/write operation to be performed on a bank to which an auto precharge mode is applied, when the control signal has the first level.

The operation control unit may control the read/write operation to be performed on a bank to which an open page mode is applied, when the control signal has the second level.

According to example embodiments, there may be provided a method of controlling a semiconductor memory device including setting a plurality of banks of a memory, providing one of different modes and a same mode independently to the plurality of banks, and/or controlling a read/write operation to be performed on data stored in a bank.

According to example embodiments, the setting may include a plurality of bank groups, each bank group having at least one of the banks. The providing may include the same mode being applied to each bank in a bank group. The controlling may be performed in response to a control signal.

The providing may include providing an auto precharge mode to a bank group and an open page mode to another bank group.

The providing may include providing one of an auto precharge mode and an open page mode to the plurality of bank groups.

The logic level of the control signal may depend on a type of the data.

The controlling may include controlling the read/write operation to be performed on a bank to which an auto precharge mode is applied, when the data randomly accesses a row of a bank.

The controlling may include controlling the read/write operation to be performed on a bank to which an open page mode is applied, when the data repeatedly accesses a same row of a bank.

According to example embodiments, the method of controlling a semiconductor memory device may further include selecting a bank from among the plurality of banks to which one of the auto precharge mode and the open page mode is applied, in response to a control signal. The providing may include an auto precharge mode being applied to at least one of the plurality of banks and an open page mode being applied to the other banks. The controlling may be performed on the data in the selected bank.

BRIEF DESCRIPTION

The above and other features and advantages will become more apparent by describing in detail example embodiments thereof with reference to the attached drawings in which:

FIG. 5A is a timing diagram of a read operation performed on a conventional memory bank to which an open page mode is applied; and FIG. 5B is a timing diagram of a read operation performed on a conventional memory bank to which an open precharge mode is applied.

DETAILED DESCRIPTION

Figure 1:
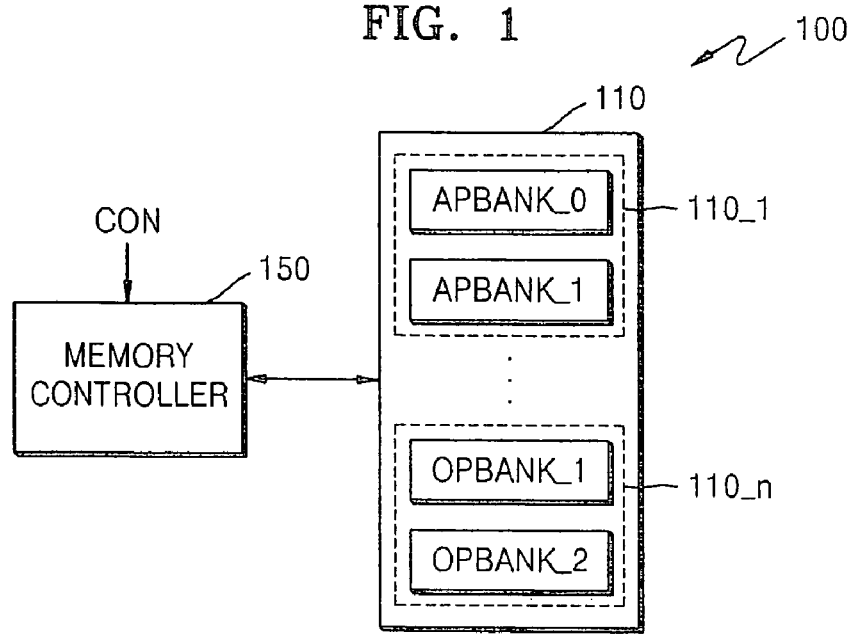
FIG. 1 is a block diagram of a semiconductor memory device according to example embodiments.

Example embodiments will now be described more fully with reference to the accompanying drawings. Like reference numerals denote like elements throughout the drawings.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of example embodiments.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

FIG. 1 is a block diagram of a semiconductor memory device 100 according to example embodiments. Referring to FIG. 1, the semiconductor memory device 100 may include a memory 110 having a plurality of memory banks ("banks") APBANK_0, APBANK_1, OPBANK_0, OPBANK_1, and a memory controller 150 that controls the operation of the memory 110.

The memory 110 may include first through nth bank groups 110_1 to 110_n, each having at least one of the banks, where n is a natural number. Either different modes or the same mode may be applied to the first through nth bank groups 110_1 to 110_n.

In FIG. 1, it may be assumed that an auto precharge mode is applied to the banks APBANK_0 and APBANK_1 included in the first bank group 110_1 and an open page mode is applied to the banks OPBANK_0, OPBANK_1 included in the nth bank group 110_n. However, it would be apparent to those of ordinary skill in the art that similarly, a predetermined mode may be applied to the other banks in units of bank groups. Alternatively, one of the auto precharge mode and the open page mode may be applied to all the banks included in the first through nth group 110_1, through to 110_n. Hereinafter, a bank to which the auto precharge mode is applied will be referred to as "an auto precharge bank", and a bank to which the open page mode is applied will be referred to as "an open page bank".

A mode that is to be applied to each of the banks included in the first through nth bank group 110_1, through to 110_n may be preferably determined while booting. That is, a mode that is to be applied to each of the banks may be preferably determined before performing a read/write operation. For example, if the first through nth bank groups 110_1 to 110_n are present as illustrated in FIG. 1, the banks APBANK_0 and APBANK_1 included in the first bank group 110_1 and the banks OPBANK_0 and OPBANK_1 included in the nth bank group 110_n may be respectively determined as the auto precharge banks and the open page banks before performing the read/write operation. However, it would be apparent to those of ordinary skill in the art that while the semiconductor memory device 100 operates, it may be possible to set the open page mode to be applied to the banks APBANK_0 and APBANK_1 to which the auto precharge mode has already been applied, or the auto precharge mode to be applied to the banks OPBANK_0 and OPBANK_1 to which the open page mode has already been applied.

The auto precharge mode may be a mode in which the memory 110 automatically performs a precharge operation after the read/write operation is performed. That is, the auto precharge banks APBANK_0, APBANK_1 of the first bank group 110_1 may automatically perform the precharge operation on an activated row after performing the read/write operation thereon, even if an additional precharge command is not given from the memory controller 150. Thus, it may be effective to use the auto precharge mode when it is highly probable that a currently accessed row will not be repeatedly accessed.

The open page mode may be a mode in which an activated row remains activated until a precharge command is given from the memory controller 150. That is, the open page banks OPBANK_0 and OPBANK_1 of the nth bank group 110_n may maintain the activation of an activated row, and perform the precharge operation only when an additional precharge command is given from the memory controller 150. Accordingly, it may be effective to use the open page mode when it is highly probable that a currently accessed row will be repeatedly accessed. The operations of the auto precharge banks APBANK_0 and APBANK_1 and the open page banks OPBANK_0 and OPBANK_1 will be described later in detail with reference to FIG. 5.

The memory controller 150 may control the read/write operation to be performed on a bank belonging to a group from among the first through nth group 110_1 to 110_n, in response to a control signal CON. For example, if data is to be read from or written to a bank to which the auto precharge mode is applied, the read/written operation may be controlled to be performed on one of the auto precharge banks APBANK_0 and APBANK_1 belonging to the first bank group 110_1. For data writing, the memory controller 150 may receive data (not shown), and control the data to be written to a bank belonging to a group from among the first through nth groups 110_1 to 110_n, in response to a control signal CON. In order to read the written data, the memory controller 150 may read the data stored in the bank belonging to a group from among the first through nth groups 110_1 to 110_n, in response to a control signal CON.

The logic level of the control signal CON may depend on the type of data. That is, the control signal CON may have a first level when the data randomly accesses a row of a bank, and may have a second level when the data repeatedly accesses the same row of a bank. Hereinafter, for convenience of explanation, the first level will be used to indicate a logic high level and the second level will be used to indicate a logic low level, but it would be apparent to those of ordinary skill in the art that the same effect may be achieved if first level and second level are identified conversely.

The memory controller 150 may perform an operation depending on the logic level of the control signal CON. That is, if the control signal CON has the first level, the memory controller 150 may control the read/write operation to be performed on the auto precharge banks APBANK_0 and APBANK_1. This is because it may be effective to read or write data by applying the auto precharge mode when data, such as video data, randomly accesses a row of a bank.

If the control signal CON has the second level, the memory controller 150 may control the read/write operation to be performed on the open page banks OPBANK_0 and OPBANK_1. This is because it may be effective to read or write data by applying the open page mode when data, such as three-dimensional (3D) graphics data, repeatedly accesses the same row of a bank.

Figure 2:
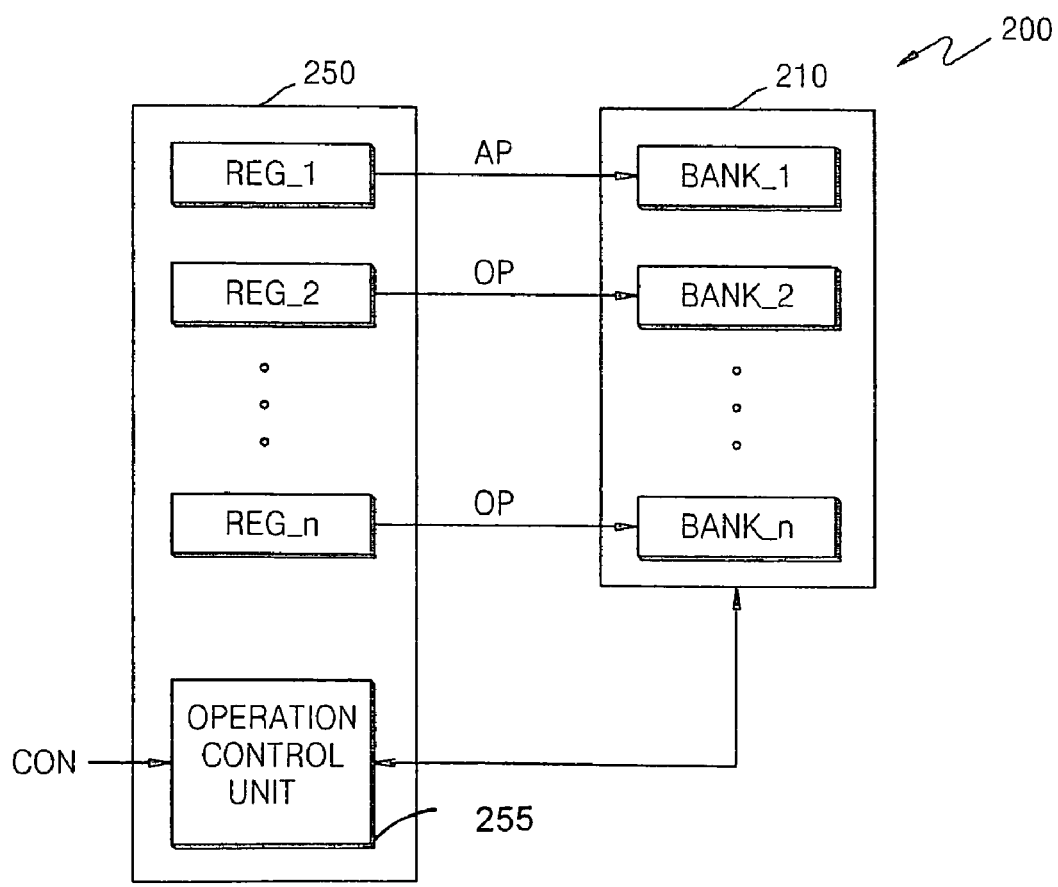
FIG. 2 is another block diagram of a semiconductor memory device according to example embodiments.

FIG. 2 is another block diagram of a semiconductor memory device 200 according to example embodiments. Referring to FIG. 2, the semiconductor memory device 200 may include a memory 210 and a memory controller 250. The memory 210 may include first through nth banks BANK_1, BANK_2, through to BANK_n.

The memory controller 250 may include first through nth registers REG_1, REG_2, through to REG_n, and an operation control unit 255.

The first through nth registers REG_1, REG_2, through to REG_n may respectively store mode information regarding the corresponding first through nth banks BANK_1, BANK_2, through to BANK_n. The mode information may indicate whether the auto precharge mode or the open page mode is to be applied to each of the corresponding banks. A mode of each of the corresponding banks may be determined based on the stored mode information. For example, if the mode information stored in the first register REG_1 is auto precharge mode information AP, the auto precharge mode may be applied to the first bank BANK_1 corresponding to the first register REG_1. If the mode information in the nth register REG_N is open page mode information OP, the open page mode may be applied to the nth bank BANK_n corresponding to the nth register REG_n.

The operation control unit 255 may operate in a similar manner to the memory controller 150 illustrated in FIG. 1. That is, the operation control unit 255 may control the read/write operation to be performed on one of the first through nth banks BANK_1, BANK_2, through to BANK_n, in response to a control signal CON. Similar to the memory controller 150, the operation control unit 255 may control the read/write operation to be performed on a bank to which the auto precharge mode or the open page mode is applied, based on the logic level of the control signal CON. The control signal CON may be identical or similar to the control signal CON illustrated in FIG. 1. That is, if the control signal CON has the first level, the operation control unit 255 may control the read/write operation to be performed on a bank to which the auto precharge mode is applied. If the control signal CON has the second level, the operation control unit 255 may control the read/write operation to be performed on a bank to which the open page mode is applied.

Figure 3:
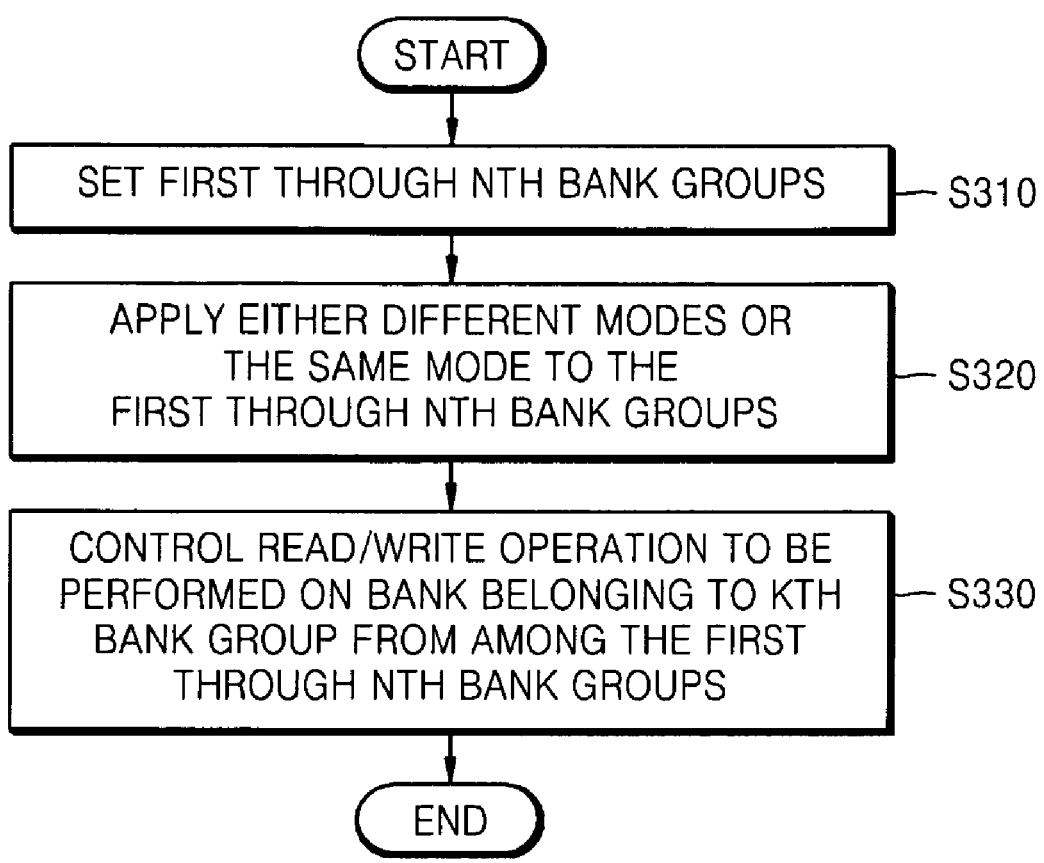
FIG. 3 is a flowchart illustrating a method of controlling a semiconductor memory device according to example embodiments.

FIG. 3 is a flowchart illustrating a method of controlling a semiconductor memory device according to example embodiments. Referring to FIGS. 1 and 3, in the semiconductor memory device 100 having the plurality of banks APBANK_0, APBANK_1, OPBANK_0, and OPBANK_1, first through nth bank groups 110_1 to 110_n, each having at least one bank selected from among the banks, may be set at S310. Next, either different modes or the same mode may be applied to the first through nth bank groups 110_1 to 110_n at S320. For example, the auto precharge mode may be applied to the first bank group 110_1 and the open page mode may be applied to the nth bank group 110_n. Alternatively, the same mode, e.g., the auto precharge mode or the open page mode, may be applied to all the banks in the first through nth bank groups 110_1 to 110_n. Thereafter, the memory controller 150 may control the read/write operation to be performed on a bank belonging to a bank group, e.g., a kth bank group, from among the first through nth bank groups 110_1, through to 110_n, in response to a control signal CON at S330.

Figure 4:
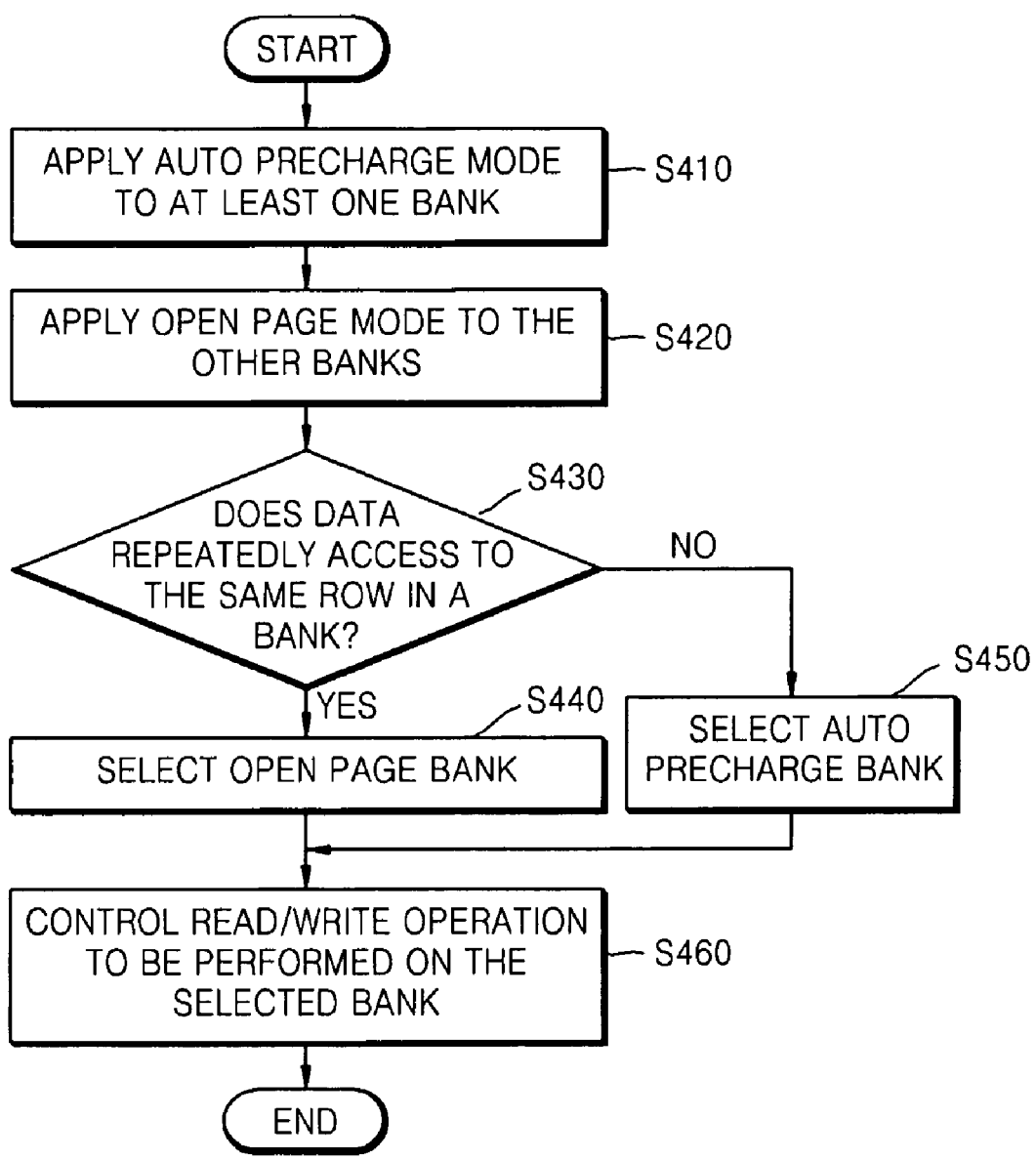
FIG. 4 is another flowchart illustrating a method of controlling a semiconductor memory device according to example embodiments.

FIG. 4 is another flowchart illustrating a method of controlling a semiconductor memory device according to example embodiments. In more detail, FIG. 4 illustrates a case where the auto precharge mode and the open page mode from among a plurality of modes may be applied. Referring to FIG. 4, the auto precharge mode may be applied to at least one of a plurality of banks at S410, and the open page mode may be applied to the other banks at S420. Referring to FIG. 2, the registers REG_1, REG_2, through to REG_n that respectively store mode information regarding corresponding banks BANK_1, BANK_2, through to BANK_n may be used in order to apply the auto precharge mode or the open page mode.

Then, one of an auto precharge bank and an open page bank may be selected in response to a control signal. That is, the logic level of the control signal may change depending on whether the data repeatedly accesses the same row of a bank, and thus, a bank may be selected depending on the logic level of the control signal at S430. When the data repeatedly accesses the same row of a bank, the open page bank may be selected at S440. When the data does not repeatedly access to the same row of a bank, such as when the data randomly accesses a row of the bank, the auto precharge bank may be selected at S450. The memory controller 150 of FIG. 1 or the operation control unit 255 of FIG. 2 may control the read/write operation to be performed on the selected bank at S460.

FIG. 5A is a timing diagram of a read operation performed on a conventional bank to which the open page mode is applied. FIG. 5B is a timing diagram of a read operation performed on a conventional bank to which the auto precharge mode is applied.

Referring to FIG. 5A, a first read command READ may be applied to a row of an open page bank at a time t1, and a second read command may be applied again to the same row at a time t2. After a column address strobe or column address select ("CAS") latency CL, data Q0, Q1, Q2, and Q3 according to the first read command READ may be read, and then, data Q0', Q1', Q2', and Q3' according to the second read command READ may be read. However, in order to perform the read operation on another row that is not currently accessed at a time t3, a precharge operation must generally be performed in response to a precharge command PRE prior to the performing of the read command READ.

Referring to FIG. 5B, a first read command READ may be applied to an auto precharge bank at a time t1, and then, the precharge operation may be automatically performed after a CAS latency CL. That is, the auto precharge bank may automatically perform the precharge operation at an instant of time when first data Q0 is read at time t2. Then, in order to perform the read operation at a time t3, an activation command ACT may be executed to activate a row on which the read operation is to be performed at the time t3 since the precharge operation has already been performed.

In order to repeatedly access a currently accessed row, the open page bank of FIG. 5A may require a time equal to the CAS latency CL, i.e., the interval between the times t1 and t2. However, the auto precharge bank of FIG. 5B may require the sum of the CAS latency CL and periods of time $t_{RP}$ and $t_{RCD}$ to repeatedly access a currently accessed row. As illustrated in FIGS. 5A and 5B, $t_{RP}$ may denote a period of time required to perform the precharge operation on a currently accessed row. That is, $t_{RP}$ may represent the interval between when the precharge command PRE is given and when an activation command ACT is given. The time $t_{RCD}$ may denote a period of time required to activate a new row. That is, $t_{RCD}$ may represent the interval between when the activation command ACT is given and when the read command READ is given. In order to repeatedly access a currently accessed row, the total period of time required in the auto precharge bank may be greater than in the open page bank by the sum of the times $t_{RP}$ and $t_{RCD}$. Since the open page bank does not perform the precharge operation after performing the read operation, the total period of time required may be less than the auto precharge bank by the sum of the periods of time $t_{RP}$ and $t_{RCD}$. Accordingly, the open page bank may be more advantageous than the auto precharge bank when repeatedly accessing a currently accessed row.

However, if a currently accessed row is not repeatedly accessed, that is, if rows are randomly accessed, the auto precharge bank may be more effective than the open page bank. In order to access a row that is not currently accessed at the time t3 after the read command READ is applied at the time t2, the open page bank of FIG. 5A may begin performing the precharge operation at the time t3, in response to the precharge command PRE. Thus, for data reading, the open page bank may require the sum of the periods of time $t_{RP}$ and $t_{RCD}$ and the CAS latency CL until data Q0", Q1", Q2", Q3" are read in response to a read command READ. This is because the open page bank may not automatically perform the precharge operation after the read operation is performed. However, the auto precharge bank of FIG. 5B may automatically perform the precharge operation CAS latency CL after the read command READ is executed at the time t2. That is, at the time t3, the precharge operation need not be performed, and thus, the activation command ACT may be applied without applying the precharge command PRE. Thus, the sum of the period of time $t_{RCD}$ and the CAS latency CL may be required until data Q0', Q1', Q2', and Q3' are read. Accordingly, the total period of time required to perform the precharge operation in the open page bank may be greater by the time $t_{RP}$ than in the auto precharge bank. Also, the auto precharge bank may directly precharge a currently accessed row, and thus require less power than the open page bank. For this reason, when a currently accessed row is not repeatedly accessed, the auto precharge bank may be more effective than the open page bank.

Accordingly, in example embodiments, the read/write operation may be performed on the auto precharge bank to which the auto precharge mode is applied when data randomly accesses a row in a bank, and the read/write operation may be performed on the open page bank to which the open page mode is applied when data repeatedly accesses the same row in a bank.

As described above, in a semiconductor memory device in which a mode of a bank may be independently selected, a memory controller of the semiconductor memory device, and a method of controlling the semiconductor memory device according to example embodiments, different modes or the same mode may be applied to all banks so that the read/write operation may be performed on a bank having a mode that is advantageous to the type of data, thereby minimizing consumption of power and a time delay.

While example embodiments have been particularly shown and described with reference to FIGS. 1-5B, it will be understood by those of ordinary skill in the art that various changes in form and details may be made therein without departing from the spirit and scope of example embodiments, as defined by the appended claims.

What is claimed is:

1. A semiconductor memory device comprising:
    a memory having a plurality of banks; and
    a memory controller controlling a read/write operation to be performed on data stored in one of the plurality of banks, in response to a control signal,
    wherein one of different modes and a same mode is independently applied to the plurality of banks.

2. The semiconductor memory device of claim 1, wherein the memory includes a plurality of bank groups, each bank group having at least one of the banks, and
    the same mode is applied to each bank of a bank group.

3. The semiconductor memory device of claim 2, wherein an auto precharge mode is applied to a bank group and an open page mode is applied to another bank group.

4. The semiconductor memory device of claim 2, wherein one of an auto precharge mode and an open page mode is applied to the plurality of bank groups.

5. The semiconductor memory device of claim 2, wherein a logic level of the control signal depends on a type of the data.

6. The semiconductor memory device of claim 5, wherein the control signal has a first level when the data randomly accesses a row of a bank and a second level when the data repeatedly accesses the same row in a bank.

7. The semiconductor memory device of claim 6, wherein the memory controller controls the read/write operation to be performed on a bank belonging to one of the plurality of bank groups to which an auto precharge mode is applied, when the control signal has the first level.

8. The semiconductor memory device of claim 6, wherein the memory controller controls the read/write operation to be performed on a bank belonging to one of the plurality of bank groups to which an open page mode is applied, when the control signal has the second level.

9. The semiconductor memory device of claim 2, wherein one of the different modes or the same mode is applied to the plurality of bank groups while booting.

10. The semiconductor memory device of claim 1, wherein the memory controller controls the read/write operation to be performed on the data in a bank belonging to one of the plurality of bank groups to which an auto precharge mode is applied if the data is video data.

11. The semiconductor memory device of claim 1, wherein the memory controller controls the read/write operation to be performed on the data in a bank belonging to one of the plurality of bank groups to which an open page mode is applied if the data is three-dimensional (3D) graphics data.

12. The semiconductor memory device of claim 1, wherein the memory is a synchronous dynamic random access memory (SDRAM).

13. The semiconductor memory device of claim 1, wherein the memory controller includes,
a plurality of registers storing mode information corresponding to the plurality of banks, and
an operation control unit controlling a read/write operation to be performed on one of the plurality of banks, in response to the control signal.

14. The memory controller of claim 13, wherein the mode information includes one of an auto precharge mode information and an open page mode information.

15. The memory controller of claim 13, wherein the logic level of the control signal depends on a type of the data.

16. The memory controller of claim 15, wherein the control signal has a first level when the data randomly accesses a row of a bank and a second level when the data repeatedly accesses the same row in a bank.

17. The memory controller of claim 16, wherein the operation control unit controls the read/write operation to be performed on a bank to which an auto precharge mode is applied, when the control signal has the first level.

18. The memory controller of claim 16, wherein the operation control unit controls the read/write operation to be performed on a bank to which an open page mode is applied, when the control signal has the second level.

19. The memory controller of claim 13, wherein the plurality of registers store the mode information corresponding to the plurality of banks while booting.

20. A method of controlling a semiconductor memory device comprising:
setting a plurality of banks of a memory;
providing one of different modes and a same mode independently to the plurality of banks; and
controlling a read/write operation to be performed on data stored in a bank.

21. The method of claim 20, wherein the setting includes a plurality of bank groups, each bank group having at least one of the banks,
the providing includes the same mode being applied to each bank in a bank group, and
the controlling is performed in response to a control signal.

22. The method of claim 21, wherein the providing includes providing an auto precharge mode to a bank group and an open page mode to another bank group.

23. The method of claim 21, wherein the providing includes providing one of an auto precharge mode and an open page mode to the plurality of bank groups.

24. The method of claim 21, wherein the logic level of the control signal depends on a type of the data.

25. The method of claim 21, wherein the controlling includes controlling the read/write operation to be performed on a bank to which an auto precharge mode is applied, when the data randomly accesses a row of a bank.

26. The method of claim 21, wherein the controlling includes controlling the read/write operation to be performed on a bank to which an open page mode is applied, when the data repeatedly accesses a same row of a bank.

27. The method of claim 21, wherein the providing includes providing one of the different modes or the same mode to the plurality of bank groups while booting.

28. The method of claim 20, further comprising:
selecting a bank from among the plurality of banks to which one of the auto precharge mode and the open page mode is applied, in response to a control signal, wherein
the providing includes an auto precharge mode being applied to at least one of the plurality of banks and an open page mode being applied to the other banks, and wherein
the controlling is performed on the data in the selected bank.

29. The method of claim 28, wherein the logic level of the control signal depends on a type of the data.

30. The method of claim 28, wherein the selecting of the bank includes,
selecting the bank to which the auto precharge mode is applied when the data randomly accesses a row in a bank, and
selecting the bank to which the open page mode is applied when the data repeatedly accesses the same row in a bank.

* * * * *